(12) United States Patent
Murata et al.

(10) Patent No.: US 6,793,405 B1
(45) Date of Patent: Sep. 21, 2004

(54) OPTICAL MODULE

(75) Inventors: Akihiro Murata, Suwa (JP); Shojiro Kitamura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/509,669

(22) PCT Filed: Jul. 22, 1999

(86) PCT No.: PCT/JP99/03927

§ 371 (c)(1),
(2), (4) Date: Apr. 4, 2000

(87) PCT Pub. No.: WO00/08505

PCT Pub. Date: Feb. 17, 2000

(30) Foreign Application Priority Data

Aug. 5, 1998 (JP) .......................................... 10-233608

(51) Int. Cl.$^7$ .............................................. G02B 6/36
(52) U.S. Cl. .......................................... 385/88; 385/94
(58) Field of Search .............................. 385/49, 88, 92, 385/93, 94, 130, 131

(56) References Cited

U.S. PATENT DOCUMENTS

| | | | | |
|---|---|---|---|---|
| 4,756,590 A | * | 7/1988 | Forrest et al. | 385/89 |
| 5,125,054 A | | 6/1992 | Ackley et al. | 385/49 |
| 5,177,753 A | | 1/1993 | Tanaka | 372/36 |
| 5,940,550 A | | 8/1999 | Plickert et al. | 385/15 |

FOREIGN PATENT DOCUMENTS

| | | |
|---|---|---|
| DE | 196 16 969 A1 | 10/1997 |
| DE | 197 14 170 C1 | 7/1998 |
| GB | 2 312 551 A | 10/1997 |
| JP | A-3-290606 | 12/1991 |
| JP | A-4-152584 | 5/1992 |
| JP | A-6-222230 | 8/1994 |
| JP | A-6-223402 | 8/1994 |
| JP | A-7-168039 | 7/1995 |
| JP | A-8-32046 | 2/1996 |
| WO | WO 95/25974 | 9/1995 |

OTHER PUBLICATIONS

T. Hayashi; "An Innovative Bonding Technique for Optical Chips Using Solder Bumps That Eliminate Chip Positioning Adjustments"; IEEE Transactions on Components, Hybrids, and Manufacturing Technology, Apr. 15, 1992, No. 2, New York; pp. 225–230.

T. Nagata et al.; "Single Chip Integration of LED, Waveguide and Micromirrors"; Extended Abstracts of the 1994 International Conference on Solid State Devices & Materials, Yokohama, Japan; Aug. 23–26, 1994; pp. 90–92.

Optical Technology Contact, cited on p. 1 of the specification, vol. 36, No. 4, 1998.

* cited by examiner

*Primary Examiner*—Mark A. Robinson
*Assistant Examiner*—Alessandro Amari
(74) *Attorney, Agent, or Firm*—Oliff & Berridge, PLC

(57) ABSTRACT

An optical module which can be made more compact and lightweight. An end portion (18) of a mounting substrate (10) forms a mirror which reflects light through 90 degrees. A surface-emission laser (22) is disposed so that a light-emitting aperture (28) faces the end portion (18). Within the mounting substrate (10) are formed a core (12) extending along the plane of the mounting substrate (10) and a cladding (14). The mounting substrate (10) doubles as an optical waveguide. Therefore, the optical module can be made thinner. As a result, the optical module can be made more compact and lightweight.

15 Claims, 2 Drawing Sheets

OPTICAL MODULE

TECHNICAL FIELD

The present invention relates to an optical module which is formed by integrating an optical element, optical waveguide, or the like.

BACKGROUND ART

An optical module is a transducer from electrical energy to light, or from light to electrical energy. An optical module is constituted in hybrid integrated form by an optical element, an optical waveguide, an electrical circuit, and the like. An optical module is used, for example, in an optical fiber communications system.

FIG. 3 shows schematically the disposition of an optical waveguide and optical element in a conventional optical module. This is disclosed in the journal *Optical Technology Contact* Vol. 36, No. 4 (1998). On a principal surface of a mounting substrate 40, a depression 42 is provided. In the depression 42 is mounted an optical element 44. On the principal surface of the mounting substrate 40 is fitted an optical waveguide 46. The end portion 48 of the optical waveguide 46 is positioned over the optical element 44. The end portion 48 forms a mirror. Light 50 emitted by the optical element 44 is reflected by the end portion 48, and enters the core 52 of the optical waveguide 46. The light 50 proceeds in the direction shown by an arrow within the core 52, and is transmitted through the optical fiber or the like.

However, this requires both alignment accuracy when mounting the optical element on the mounting substrate and alignment accuracy between the mounting substrate on which the optical element is mounted and the optical waveguide. In particular, for an optical module such as an optical fiber requiring positioning accuracy with an error of ±1 to ±5 μm, there is also a requirement to reduce as far as possible the number of locations at which this alignment accuracy is required.

Further, electronic instruments are required to be more compact and lightweight, as a result of which, compactness, light weight, and low cost are requirements for optical modules.

This invention solves this problem. The objective of this invention is the provision of an optical module which can be made more compact and lightweight.

DISCLOSURE OF THE INVENTION (1) An optical module of this invention comprises:
a mounting member having a principal surface; an interconnect formed on the mounting member; and an optical element mounted on the principal surface and electrically connected to the interconnect,
wherein the mounting member is an optical waveguide for guiding light emitted from the optical element or light admitted to the optical element.

In a conventional optical module, on a mounting member is mounted an optical waveguide separate from the mounting member. In contradistinction, this invention has the mounting member and optical waveguide as an integral member. The optical module can therefore be made thinner. As a result, the optical module can be made more compact and lightweight.

In a conventional optical module, there are three members involved in the positioning: the mounting member, the optical waveguide, and the optical element. On the other hand, in this invention there are two: the mounting member (optical waveguide) and the optical element. Therefore, in this invention, the optical element positioning is made easier, and the bonding accuracy can be improved.

A light-admitting aperture or light-emitting aperture of the optical element may be disposed opposing the principal surface. Such an optical element may be, for example, a surface-emission laser.

A light-reflecting member may be provided on the optical waveguide. Through the light-reflecting member, light can be transmitted between the optical element and the optical waveguide.

(2) An optical module of this invention comprises: an optical element for emitting or admitting light; and an optical waveguide having a principal surface, with the optical element mounted on the principal surface, for guiding light emitted from the optical element or light admitted to the optical element.

This aspect of the invention has the same effect as the aspect (1) of the invention.

The optical element and the optical waveguide may be fixed with an adhesive member having light transmitting characteristics interposed between the optical element and the optical waveguide in such a way that the position of emission or admission of light of the optical element opposes the optical waveguide, and be subjected to bare chip mounting.

Bare chip mounting allows more compact and lightweight design than with package mounting. In this aspect, since the optical element is subjected to bare chip mounting, the optical module can be made more compact and lightweight. The optical element and optical waveguide and are fixed by an adhesive member having light transmitting characteristics. By virtue of this, the optical element and the optical waveguide can be fixed and an optical path between the optical element and the optical waveguide can be assured.

The optical waveguide may have a modifying portion whereby the direction of progress of the light is changed; and the optical element may be positioned to overlie the modifying portion. By virtue of this, the direction of progress of the light can be efficiently changed.

The modifying portion is formed in the optical waveguide, and the optical element is directly mounted to the optical waveguide having the modifying portion. By virtue of this, the relative positioning (distance and the like) of the optical element and modifying portion can always be maintained constant, as a result of which there can be no loss of focus with respect to the modifying portion. On the other hand, in the prior art, the optical element is not mounted directly on the optical waveguide, and therefore the optical waveguide and optical element are disposed separated from each other. For this reason, when both are fixed with respect to other elements, there is a possibility of relative movement between the two. Therefore, even if the positioning operation is achieved, thereafter there is the possibility of a change in the positioning caused by various influences (heat, external pressure, and the like).

It should be noted that in the expression "positioned to overlie the modifying portion," the term "overlie" indicates that when seen projected from the optical element or modifying portion, both are disposed in positions such that it appears that both coincide.

On the principal surface of the optical waveguide may be further mounted a semiconductor element in addition to the optical element, and the optical element and the semiconductor element may be integrally sealed with a resin.

If the optical element and semiconductor element are mounted on the principal surface of the optical waveguide, the interconnect connecting the two may be made shorted. The formation of the interconnect on the mounting substrate can be single layer, and the interconnect formation is made easier. If the optical element and semiconductor element are integrally sealed with a resin, the strength of the optical module can be improved. If the optical element and semiconductor element are hybrid, the degree of integration of the optical module can be improved. By the improvement of this degree of integration, the cost can be lowered.

The resin may have light blocking characteristics. If light impinges on the semiconductor element, faulty operation of the semiconductor element is possible. By sealing the semiconductor element with a resin having light blocking characteristics, faulty operation can be prevented.

The semiconductor element may have a function of driving the optical element.

Since the optical element and the semiconductor element driving or controlling the optical element are mounted on the principal surface of the optical waveguide, the optical module can be made a module of high added value. A higher degree of integration of the optical module and a lower cost can also be achieved.

A circuit may be laminated directly on the principal surface of the optical waveguide. If a circuit is laminated directly on the principal surface of the optical waveguide, the mounting of the semiconductor element is not required. Therefore, it is no longer necessary to consider the reliability of connection between different components. In respect of connections between integrated circuit elements, the connections can be eliminated, and by virtue of this, the interconnect impedance characteristics and noise characteristics can be improved, while the effect of delays can be held to a minimum. The degree of integration on the principal surface of the optical waveguide can be improved, and a high degree of integration of the optical module and low cost can be achieved.

(3) An optical module of the invention comprises: an optical element; and a mounting member which has a function of an optical waveguide for guiding light emitted from the optical element or light admitted to the optical element and is electrically connected to the optical element or a semiconductor element associated therewith.

This aspect of the invention has the same effect as the aspect (1) of the invention.

(4) An optical module of this invention comprises: a mounting member having a principal surface and a lateral surface; and an optical element mounted on the principal surface, wherein the mounting member has a function of an optical waveguide, and an optical input/output terminal for the optical waveguide is provided on the lateral surface of the mounting member.

This aspect of the invention has the same effect as the aspect (1) of the invention. It should be noted that an optical input/output terminal means a terminal at which light is input, or a terminal at which light is output, or a terminal at which light is input and/or output.

It should be noted that optical elements include both elements which emit light and elements which receive light. The mounting member may be in plate, film, or other form, as long as it allows the optical element to be mounted.

BEST MODE FOR CARRYING OUT THE INVENTION

Structure

Figure 1:
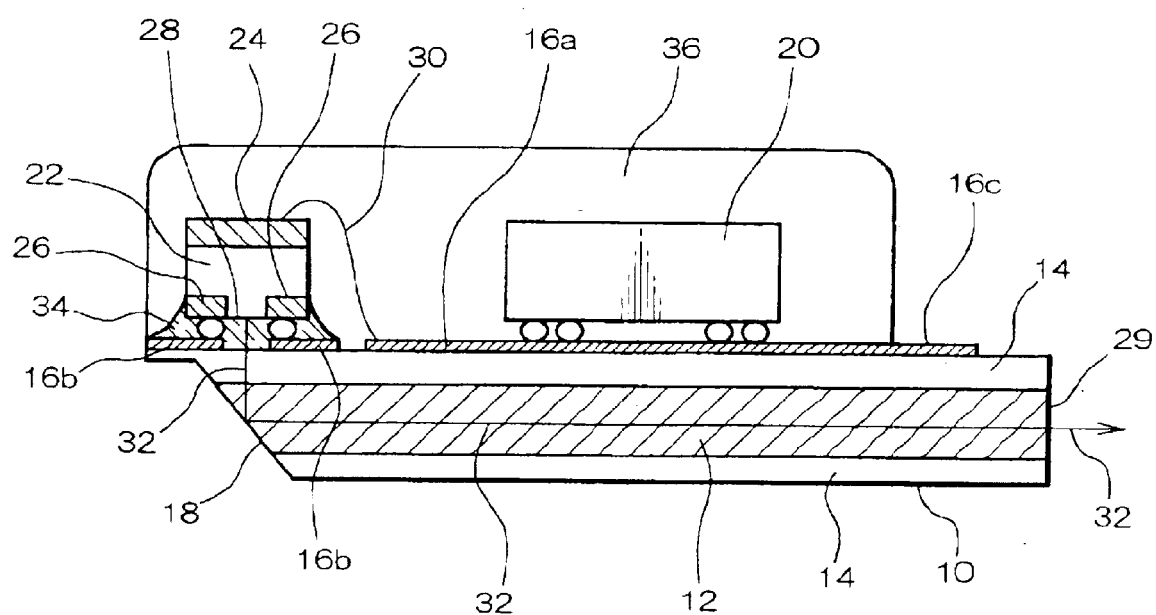
FIG. 1 shows a schematic cross-section of one embodiment of the optical module of this invention.
Figure 2:
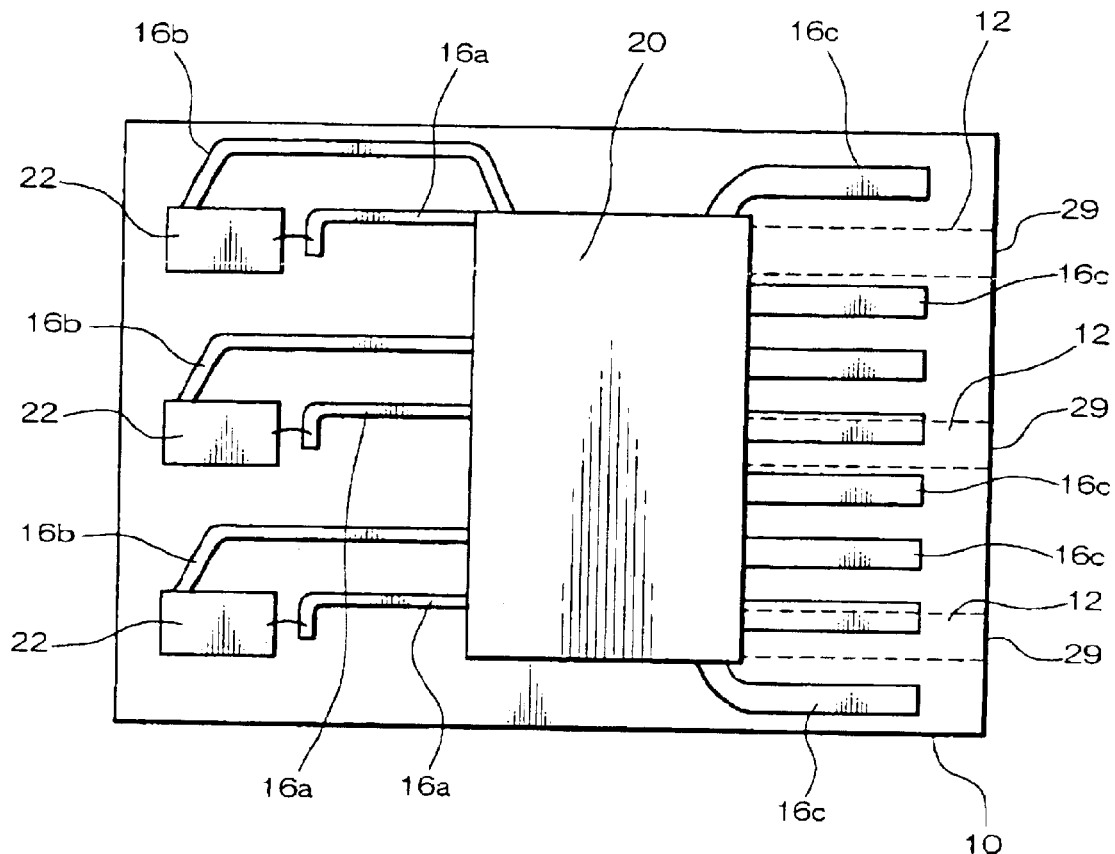
FIG. 2 shows a schematic plan view of one embodiment of the optical module of this invention.
Figure 3:
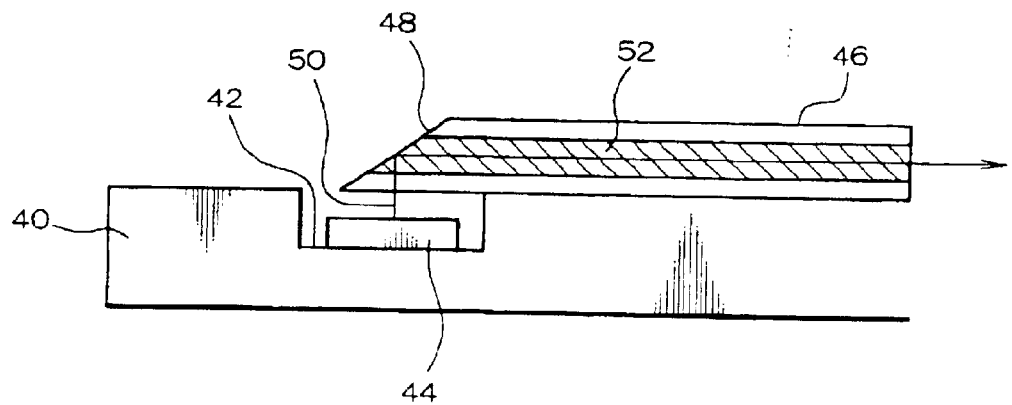
FIG. 3 shows schematically the relative disposition of the optical waveguide and optical element of a conventional optical module.

FIG. 1 shows a schematic cross-section of one embodiment of the optical module of this invention. FIG. 2 shows a schematic plan view thereof. A glass mounting substrate 10 doubles as an optical waveguide. Thus, within the mounting substrate 10 are formed a core 12 and cladding 14 extending along the surface for mounting an optical element on the mounting substrate 10. The core 12 and cladding 14 are formed within the mounting substrate 10 by using thin-film formation techniques, photolithography, or the like.

One end portion 18 of the optical waveguide forms a 45-degree mirror by which the light is bent through 90 degrees. The 45-degree mirror is formed by using for example a 90-degree V-shape diamond saw, to machine the end portion 18 of the optical waveguide. On the lateral surface of the mounting substrate 10, and at the other end portion of the optical waveguide, is disposed an optical output terminal 29. Light passes along the core 12, and is output from the optical output terminal 29.

On the mounting substrate 10, interconnects 16a, 16b, and 16c are formed from a metal foil or the like. In this embodiment, the interconnects 16a, 16b, and 16c are formed on the principal surface of the mounting substrate 10, but these may equally be formed on a lateral surface of the mounting substrate 10. Alternatively, interconnects may be formed on the surface opposite to the principal surface of the mounting substrate 10 (the rear surface), and may be electrically connected to the principal surface through through holes or the like formed in the mounting substrate 10. Instead, the interconnects may be formed on any two or all of the principal surface, a lateral surface and the rear surface of the mounting substrate 10. It should be noted that the largest surface of the mounting substrate 10 is commonly the principal surface, but even if not the largest surface, the surface on which it is possible to mount the optical element is the principal surface.

A semiconductor chip 20 is electrically connected by the flip-chip bonding to the interconnects 16a and 16c. That is to say, metal bumps are formed on the electrodes of the semiconductor chip 20, and the semiconductor chip 20 is connected to the mounting substrate 10 forming the interconnect substrate by the face-down bonding. The semiconductor chip 20 has a CMOS circuit, for example. The interconnect 16c forms an electrical input/output terminal. In this embodiment, one semiconductor chip 20 is fitted, but a plurality of semiconductor chips 20 may be fitted. For example, a plurality of semiconductor chips 20 may be fitted corresponding to a plurality of optical elements.

A surface-emission laser 22 is electrically connected to an interconnect 16b by the flip-chip bonding. On one surface of the surface-emission laser 22 is formed an electrode 24 on the other surface are formed electrodes 26 and a light-emitting aperture 28. The surface-emission laser 22 is disposed on the principal surface of the mounting substrate 10 so that light emitted from the aperture 28 is reflected by the end portion 18, to pass along the core 12. The electrodes 26 and interconnect 16b are electrically connected. The emitting aperture 28 and electrodes 26 are sealed with a transparent resin 34 having light transmitting characteristics. The transparent resin 34 is a silicone resin having light transmitting characteristics. The electrode 24 is electrically connected to the interconnect 16a by a wire 30. In this embodiment, a plurality of surface-emission lasers 22 are provided as an example of a plurality of optical elements, but the present invention is not limited to this. For example, a single optical element may be provided, and this optical element may have a plurality of light-admitting apertures or light-emitting apertures. Naturally, a single optical element with a single light-admitting aperture or light-emitting aperture may also be provided.

The semiconductor chip 20 and surface-emission laser 22 are sealed with a resin 36 having light blocking characteristics. However, the resin 36 is provided in such a way as not to impede the passage of light between the optical element (for example, the surface-emission laser 22) and the optical waveguide (for example the core 12). The resin 36 is an epoxy resin. The components of the epoxy resin are from 10 to 50 per cent epoxy and from 90 to 50 per cent filler (silica or the like). In this embodiment, three optical waveguides are aligned in parallel. That is to say, the three cores 12 forming the three optical waveguides are formed within the mounting substrate 10. Moreover, the three cores 12 (optical waveguides) are disposed in parallel, and the optical output terminal 29 of each of their cores 12 (optical waveguides) are formed on the same lateral surface of the mounting substrate 10. The three surface-emission lasers 22 connected to the optical waveguides are mounted on the mounting substrate 10 at the end distant from the optical output terminals 29.

Operation

Electrical signals from the semiconductor chip 20 are transferred to the surface-emission laser 22. By this means, the surface-emission laser 22 emits light 32. The light 32 is emitted from the emitting aperture 28, and at the end portion 18 of the optical waveguide is reflected through 90 degrees. Then it proceeds along the center of the core 12 in the direction of the arrow, and is transmitted through the optical output terminal 29 to an optical fiber or the like.

Effect

In this embodiment, the mounting substrate 10 doubles as an optical waveguide. Therefore, the optical module can be made thinner. As a result, the optical module can be made more compact and lightweight.

In this embodiment, when aligning the optical waveguide and surface-emission laser 22, there are two items involved in the positioning: the mounting substrate 10 (optical waveguide) and the surface-emission laser 22. Thus the bonding of the surface-emission laser and the optical waveguide which conventionally was complicated and time-consuming is simplified, and the bonding strength can also be improved. Additionally, the costs associated with bonding can be reduced.

Other matters

In this embodiment, the direction of the light is changed by a 45-degree mirror. However, this is not limitative of the invention, and this any other component appropriate for changing the direction of the light may be applied in the invention.

In this embodiment, the direction of the light is changed at the end portion of the waveguide. However, this is not limitative of the invention, and the direction of the light may be changed at a portion other than the end portion of the waveguide.

In this embodiment, the surface-emission laser 22 must inject light into the optical waveguide, and therefore the mounting position of the surface-emission laser 22 is restricted. However, the semiconductor chip 20 can be mounted anywhere as long as it is on the principal surface of the mounting substrate 10.

In this embodiment, the surface-emission laser 22 and semiconductor chip 20 are mounted on the mounting substrate 10 by the flip-chip bonding. However, this is not limitative of the invention, and the surface-emission laser 22 or semiconductor chip 20 may equally be mounted by face-up bonding or the like.

In this embodiment, the semiconductor chip 20 is mounted on the mounting substrate 10. However, this is not limitative of the invention, and on the principal surface of the mounting substrate 10 may be formed a circuit of thin-film transistors, which may be used in place of the semiconductor chip 20. Alternatively, with such a thin-film transistor circuit and the semiconductor chip 20 may be formed a circuit to send signals to the surface-emission laser 22.

In this embodiment, the mounting substrate 10 is made of glass. However, this is not limitative of the invention, and a polymer or suchlike film may be used for the mounting substrate 10.

In this embodiment, the surface-emission laser 22 constitutes an optical element. However, this is not limitative of the invention, and a laser diode, photodiode, or other optical element may equally be used.

What is claimed is:

1. An optical module comprising:
    a mounting member having a principal surface, said mounting member entirely made of glass and having a core and a cladding formed therein, said cladding having its surface to form said principal surface in whole;
    an interconnect formed on said mounting member;
    an optical element mounted on said principal surface and electrically connected to said interconnect; and
    a semiconductor element driving said optical element, said semiconductor element mounted on said principal surface,
    wherein said mounting member is an optical waveguide for guiding light emitted from said optical element or light admitted to said optical element.

2. The optical module as defined in claim 1,
    wherein a light-admitting aperture or light-emitting aperture of said optical element is disposed opposing said principal surface.

3. The optical module as defined in claim 2,
    wherein a light-reflecting member is provided on said optical waveguide; and
    wherein light is transmitted between said optical element and said optical waveguide through said light-reflecting member.

4. An optical module comprising:
    an optical element for emitting or admitting light;
    an optical waveguide entirely made of glass, having a core and a cladding formed therein and having a principal surface, with said optical element mounted on said principal surface, for guiding light emitted from said optical element or light admitted to said optical element, said cladding having its surface to form said principal surface in whole; and
    a semiconductor element driving said optical element, said semiconductor element mounted on said principal surface.

5. The optical module as defined in claim 4,
wherein said optical element and said optical waveguide are fixed with an adhesive member having light transmitting characteristics interposed between said optical element and said optical waveguide in such a way that the position of emission or admission of light of said optical element opposes said optical waveguide, and are subjected to bare chip mounting.

6. The optical module as defined in claim 5,
wherein said optical waveguide has a modifying portion whereby the direction of progress of said light is changed; and
wherein said optical element is positioned to overlie said modifying portion.

7. The optical module as defined in claim 4,
wherein said optical element and said semiconductor element are integrally sealed with a resin.

8. The optical module as defined in claim 5, wherein said optical element and said semiconductor element are integrally sealed with a resin.

9. The optical module as defined in claim 6,
wherein said optical element and said semiconductor element are integrally sealed with a resin.

10. The optical module as defined in claim 7, wherein said resin has light blocking characteristics.

11. The optical module as defined in claim 8, wherein said resin has light blocking characteristics.

12. The optical module as defined in claim 9, wherein said resin has light blocking characteristics.

13. The optical module as defined in claim 4,
wherein a circuit is laminated directly on said principal surface.

14. An optical module comprising:
an optical element;
a mounting member, said mounting member entirely made of glass and having a core and a cladding formed therein to have a function of an optical waveguide for guiding light emitted from said optical element or light admitted to said optical element, said mounting member electrically connected to said optical element or a semiconductor element associated with said optical element, said mounting member having a principal surface, said cladding having its surface to form said principal surface in whole; and
a semiconductor element driving said optical element, said semiconductor element mounted on said principal surface.

15. An optical module comprising:
a mounting member having a principal surface and a lateral surface, said mounting member entirely made of glass and having a core and a cladding formed therein, said cladding having its surface to form said principal surface in whole;
an optical element mounted on said principal surface; and
a semiconductor element driving said optical element, said semiconductor element mounted on said principal surface,
wherein said mounting member has a function of an optical waveguide, and an optical input/output terminal for said optical waveguide is provided on said lateral surface.

* * * * *